(12) United States Patent
Xue et al.

(10) Patent No.: US 11,393,384 B2
(45) Date of Patent: Jul. 19, 2022

(54) SHIFT REGISTER CIRCUIT, DRIVING METHOD THEREOF, GATE DRIVING CIRCUIT, AND DISPLAY APPARATUS

(71) Applicants: HEFEI BOE OPTOELECTRONICS TECHNOLOGY CO., LTD., Anhui (CN); BOE Technology Group Co., Ltd., Beijing (CN)

(72) Inventors: Wei Xue, Beijing (CN); Hongmin Li, Beijing (CN); Fengjing Tang, Beijing (CN); Ying Wang, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 713 days.

(21) Appl. No.: 16/331,745

(22) PCT Filed: Jun. 13, 2018

(86) PCT No.: PCT/CN2018/091026
§ 371 (c)(1),
(2) Date: Mar. 8, 2019

(87) PCT Pub. No.: WO2019/140859
PCT Pub. Date: Jul. 25, 2019

(65) Prior Publication Data
US 2021/0366350 A1 Nov. 25, 2021

(30) Foreign Application Priority Data

Jan. 22, 2018 (CN) .......................... 201810058000.5

(51) Int. Cl.
*G09G 3/20* (2006.01)

(52) U.S. Cl.
CPC ..... *G09G 3/2092* (2013.01); *G09G 2300/0426* (2013.01); *G09G 2310/0286* (2013.01); *G09G 2310/061* (2013.01); *G09G 2310/08* (2013.01)

(58) Field of Classification Search
None
See application file for complete search history.

(56) References Cited

U.S. PATENT DOCUMENTS

2016/0358666 A1* 12/2016 Pang ................... G09G 3/3688
2017/0330526 A1 11/2017 Fan et al.
(Continued)

FOREIGN PATENT DOCUMENTS

CN 101312019 A 11/2008
CN 104299583 A 1/2015
(Continued)

OTHER PUBLICATIONS

International Search Report dated Oct. 24, 2018, issued in counterpart application No. PCT/CN2018/091026. (11 pages).
(Continued)

*Primary Examiner* — Christopher J Kohlman
(74) *Attorney, Agent, or Firm* — WHDA, LLP (57) ABSTRACT

The present disclosure is related to a shift register circuit. The shift register circuit may include a shift output circuit and N driving output circuits. N is an integer larger than 1. Among the N driving output circuits, an i-th driving output circuit may be respectively coupled to an i-th driving clock signal terminal of N driving clock signal terminals, a pull-up node of the shift output circuit, and an i-th driving output terminal of N driving output terminals. The i-th driving output circuit may be configured to input an i-th driving clock signal from the i-th driving clock signal terminal to the i-th driving output terminal under a control of the pull-up node, wherein i is a positive integer not greater than N.

15 Claims, 7 Drawing Sheets

(56) References Cited

U.S. PATENT DOCUMENTS

2017/0358267 A1   12/2017  Feng et al.
2019/0108809 A1    4/2019  Zheng et al.

FOREIGN PATENT DOCUMENTS

| | | |
|---|---|---|
| CN | 104392704 A | 3/2015 |
| CN | 104835476 A | 8/2015 |
| CN | 105047228 A | 11/2015 |
| CN | 105096865 A | 11/2015 |
| CN | 105096889 A | 11/2015 |
| CN | 106847162 A | 6/2017 |
| CN | 107403602 A | 11/2017 |
| CN | 107507599 A | 12/2017 |
| KR | 20060034059 A | 4/2006 |
| KR | 20070117979 A | 12/2007 |
| KR | 101055206 B1 | 8/2011 |
| KR | 20150002030 A | 1/2015 |

OTHER PUBLICATIONS

Office Action dated Nov. 28, 2019, issued in counterpart CN Application No. 201810058000.5, with English translation (24 pages).

* cited by examiner

SHIFT REGISTER CIRCUIT, DRIVING METHOD THEREOF, GATE DRIVING CIRCUIT, AND DISPLAY APPARATUS

CROSS-REFERENCE TO RELATED APPLICATIONS

This application claims benefit of the filing date of Chinese Patent Application No. 201810058000.5 filed on Jan. 22, 2018, the disclosure of which is hereby incorporated in its entirety by reference.

TECHNICAL FIELD

This disclosure relates to a display technology, in particular, to a shift register circuit, a driving method thereof, a gate driving circuit, and a display apparatus.

BACKGROUND

When a display apparatus displays an image, a Gate Driver on Array (GOA) scans pixel units row-by-row. The GOA (also called a shifting register) generally comprises a plurality of cascaded shift register circuits. Each of the shift register circuits is configured to drive a row of pixel units, and the plurality of shift register circuits are configured to realize line-by-line scanning and display of multiple rows of pixel units in the display apparatus.

However, with increasing number of pixel units in the display apparatus, the number of rows scanned by the gate driving circuit in one frame of time needs to be increased. Furthermore, in older to achieve ultra-narrow frame of the display apparatus, the layout area of the shift register circuit needs to be small. In the related prior art, a plurality of transistors and capacitors are used to control potentials of signals from the shift register circuit. However, in the related prior art, the shift register circuit generally includes too many elements, so that a GOA occupies a relatively large layout area in the display apparatus.

BRIEF SUMMARY

Accordingly, one example of the present is a shift register circuit. The shift register circuit may include a shift output circuit and N driving output circuits. N is an integer larger than 1. Among the N driving output circuits, an i-th driving output circuit may be respectively coupled to an i-th driving clock signal terminal of N driving clock signal terminals, a pull-up node of the shift output circuit, and an i-th driving output terminal of N driving output terminals. The i-th driving output circuit may be configured to input an i-th driving clock signal from the i-th driving clock signal terminal to the i-th driving output terminal under a control of the pull-up node, wherein i is a positive integer not greater than N.

The shift output circuit may be respectively coupled to an input signal terminal, a reset signal terminal, a control clock signal terminal, and a shift output terminal. The shift output circuit may be configured to control a potential of the shift output terminal under a control of the input signal from the input signal terminal, a reset signal from the reset signal terminal, and a control clock signal from the control clock signal terminal.

The shift register circuit may further include comprising a pull-down circuit. The pull down circuit may be respectively coupled to a pull-down power supply terminal, each of the driving output terminals, a pull-down node of the shift output circuit, and the input signal terminal. The pull-down circuit can be configured to input the pull-down power supply signal from the pull-down power supply terminal to each of the driving output terminals under a control of the pull-down node and the input signal. The i-th driving output circuit may include a first transistor. A gate electrode of the first transistor may be coupled to the pull-up node, a first electrode of the first transistor may be coupled to the i-th driving clock signal terminal, and a second electrode of the first transistor may be coupled to the i-th driving output terminal.

The pull-down circuit may include N pull-down sub-circuits. An i-th pull-down sub-circuit of the N pull-down sub-circuits may be respectively coupled to the pull-down power supply terminal, the i-th driving output terminal, the pull-down node and the input signal terminal. The i-th pull-down sub-circuit may be configured to input the pull-down power supply signal to the i-th driving output terminal under a control of the pull-down node and the input signal.

The i-th pull-down sub-circuit may include a second transistor and a third transistor. A gate electrode of the second transistor may be coupled to the pull-down node, a first electrode of the second transistor may be coupled to the pull-down power supply terminal, and a second electrode of the second transistor may be coupled to the i-th driving output terminal. A gate electrode of the third transistor may be coupled to the input signal terminal, first electrode of the third transistor may be coupled to the pull-down power supply terminal, and a second electrode of the third transistor may be coupled to the i-th driving output terminal.

The shift register circuit may include two driving output circuits, and each of the driving output circuits may be coupled to one of two driving clock signal terminals. A period of the driving clock signal from each of the driving clock signal terminals may be half of a period of the control clock signal, and a duty ratio of each of the driving clock signals and that of the control clock signal are one half respectively.

The shift output circuit may include an input sub-circuit, an output sub-circuit, a reset sub-circuit, a pull-down control sub-circuit, and a noise reduction sub-circuit. The input sub-circuit may be respectively coupled to the input signal terminal, the first direct-current power source terminal, and the pull-up node. The input sub-circuit may be configured to input a first direct-current power source signal from the first direct-current power source terminal to the pull-up node under a control of the input signal. The output sub-circuit may be respectively coupled to the pull-up node, the control clock signal terminal, and the shift output terminal. The output sub-circuit may be configured to input the control clock signal to the shift output terminal under a control of the pull-up node. The reset sub-circuit may be respectively coupled to the reset signal terminal, the second direct-current power supply terminal and the pull-up node. The reset sub-circuit may be configured to input a second direct-current power source signal from the second direct-current power source terminal to the pull-up node under a control of the reset signal. The pull-down control sub-circuit may be respectively coupled to the pull-up node, the pull-down power supply terminal, the pull-up power supply terminal, and the pull-down node. The pull-down control sub-circuit may be configured to input the pull-down power supply signal from the pull-down power supply terminal or the pull-up power supply signal from the pull-up power supply terminal to the pull-down node under a control of the pull-up node. The noise reduction sub-circuit may be respectively coupled to the pull-down node, the pull-down power supply terminal, the pull-up node, and the shift output terminal. The noise reduction sub-circuit may be configured to input the pull-down power supply signal to the pull-up node and the shift output terminal respectively under a control of the pull-down node.

Another example of the present disclosure is a driving method of a shift register circuit. The driving method of the shift register circuit may include a charging stage, an output stage, a reset stage, and a noise reduction stage. The output stage may include N sub-output stages. The shift register circuit may include a shift output circuit, N driving output circuits, and a pull-down circuit, wherein N is an integer larger than 1. During the charging stage, a potential of an input signal from an input signal terminal may be an effective potential, the shift output circuit may charge a pull-up node under a control of the input signal, the pull-down circuit may transmit a pull-down power supply signal from a pull-down power supply terminal to each of N driving output terminals respectively under a control of the input signal, and a potential of the pull-down power supply signal may be an ineffective potential. During the output stage, the pull-up node may be kept at an effective potential, a potential of a control clock signal from a clock signal terminal may be an effective potential, and the shift output circuit may transmit the control clock signal to the shift output terminal under a control of the pull-up node. In an i-th sub-output stage of N sub-output stages, a potential of an i-th driving clock signal from an i-th driving clock signal terminal of N driving clock signal terminals may be an effective potential, and the i-th driving output circuit may transmit the i-th clock signal to the i-th driving output terminal under a control of the pull-up node. During the reset stage, a potential of a reset signal from a reset signal terminal may be an effective potential, the shift output circuit may control the potential of the pull-up node to be an ineffective potential, and each of the driving output circuits may stop outputting signals. During the noise reduction stage, the potential of the input signal and the potential of the pull-up node may be ineffective potentials; the shift output circuit may control the potential of the pull-down node to be an effective potential, and the pull-down circuit may transmit the pull-down power supply signal to each of the driving output terminals respectively under a control of the pull-down node.

During the output stage, the N driving clock signal terminals may sequentially output driving clock signals of an effective potential. The i-th driving output circuit may include a first transistor. During the i-th sub-output stage, the first transistor in the i-th driving output circuit may be tamed on under a control of the pull-up node, and the i-th driving clock signal terminal may transmit the i-th driving clock signal to the i-th driving output terminal. A duration of an effective potential of each of the driving clock signals from each of the driving clock signal terminals within each period may not be larger than 1/N of a duration of an effective potential of the control clock signal within each period, and a duration of each of the sub-output stages may not be larger than 1/N of a duration of the output stage. A potential of a driving clock signal from one of the N driving clock signal terminals may be an effective potential, and potentials of driving clock signals from the other N−1 driving clock signal terminals may be ineffective potentials.

The shift register circuit may include two driving output circuits, the output stage may include two sub-output stages, and a duration of each of the sub-output stages may be one half of a duration of the output stage. The two driving output circuits may be coupled to a first driving clock signal terminal and a second driving clock signal terminal respectively, and time sequences of the driving clock signals from the two driving clock signal terminals may be complementary to each other.

Another example of the present disclosure is a gate driving circuit. The gate driving circuit may include at least two cascaded shift register circuits. Each of the at least two cascaded shift register circuits may be the shift register circuit according to one embodiment of the present disclosure. A shift output terminal of a shift register circuit of each stage may be respectively coupled to an input signal terminal of a shift register circuit of a next stage and a reset signal terminal of a shift register circuit of a previous stage.

Another example of the present disclosure is a display apparatus. The display apparatus may include a display panel and the gate driving circuit according to one embodiment of the present disclosure. The display panel may include a plurality of gate lines. Each stage of shift register circuit in the gate drive circuit may include N driving output terminals, and each of the driving output terminal may be coupled to one of the plurality of gate lines in the display panel respectively, wherein N is an integer greater than 1.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-7. When referring to the figures, like structures and elements shown throughout are indicated with like reference numerals. The described embodiments are part of the embodiments of the present disclosure, but are not all embodiments. According to the embodiments of the present disclosure, all other embodiments obtained by persons of ordinary skill in the art without creative efforts, belong to the protective scope of the disclosure.

In this specification, the terms "first," "second," etc. may be added as prefixes. These prefixes, however, are only added in order to distinguish the terms and do not have specific meaning such as order and relative merits. In the description of the present disclosure, the meaning of "plural" is two or more unless otherwise specifically and specifically defined.

In the description of the specification, references made to the term "some embodiments," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

The transistor used in embodiments of the present disclosure can be a thin film transistor or a field effect transistor or the same apparatus of other characteristics. According to function of the circuit, transistors adopted in the embodiments of the present disclosure are mainly switch transistors. Since a source electrode and a drain electrode of each of the switch transistors are symmetrical, so the source electrode and the drain electrode thereof are interchangeable. In the current disclosure, a source electrode is called a first electrode; a drain electrode is called a second electrode. According to the figures of this disclosure, a middle terminal of the transistor is a gate electrode, a signal input terminal of the transistor is a source electrode, and a signal output terminal of the transistor is a drain electrode. In addition, the transistors used in the current disclosure can be one of N-type switch transistor or P-type switch transistor. The P-type switch transistor is turned on when the gate electrode is at a low level and turned off when the gate electrode is at a high level. The N-type switch transistor is turned on when the gate electrode is at a high level and turned off when the gate electrode is at a low level. In addition, a plurality of signals in various embodiments of the present disclosure has corresponding effective potentials and non-effective potentials respectively. The effective potential and the non-effective potential only represent two states of the potential of the signals, and do not mean that the effective potential or the non-effective potential in the whole text has a specific value. It can be understood that the effective potential is a signal potential capable of enabling electronic components.

Figure 1:
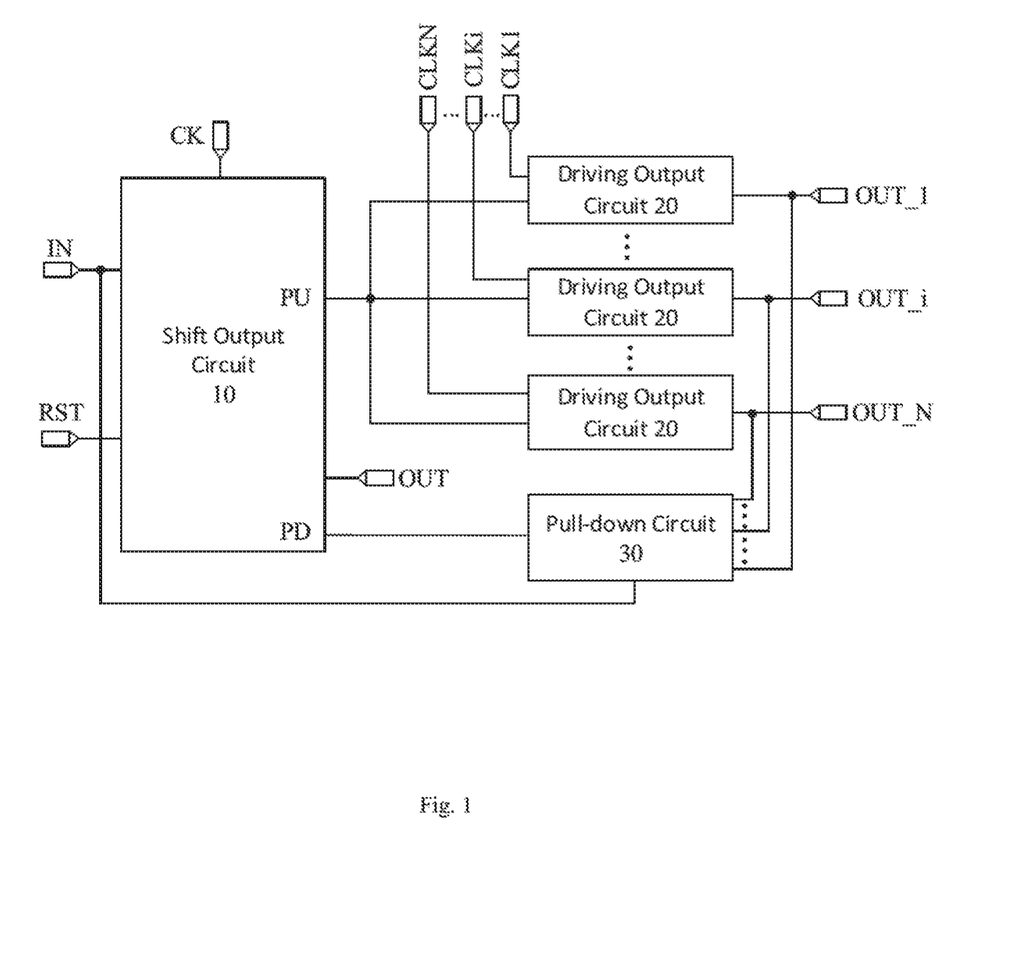
FIG. 1 is a schematic structural diagram of a shift register circuit according to some embodiments of the present disclosure.

FIG. 1 is a schematic structural diagram of a shift register circuit according to some embodiments of the present disclosure. As shown in FIG. 1, the shift register circuit includes a shift output circuit 10, N driving output circuits 20, and a pull-down circuit 30, wherein the N can be an integer greater than 1.

As shown in FIG. 1, the shift output circuit 10 is respectively coupled to an input signal terminal IN, a reset signal terminal RST, a control clock signal terminal CK, and a shift output terminal OUT. The shift output terminal OUT can be respectively coupled to the reset signal terminal of the shift register circuit of the previous stage and the input signal terminal of the shift register circuit of the next stage. The shift output circuit 10 is configured to control the potential of the shift output terminal OUT under a control of an input signal from the input signal terminal IN, a reset signal from the reset signal terminal RST, and a control clock signal from the control clock signal terminal CK.

Among the N driving output circuits 20, an i-th driving output circuit 20 is respectively coupled to the i-th driving clock signal terminal CLKi of N driving clock signal terminals, a pull-up node PU of the shift output circuit 10 and an i-th driving output terminal OUT_i of N driving output terminals. The i-th driving output circuit 20 is configured to input the i-th driving clock signal from the i-th driving clock signal terminal to the i-th driving output terminal OUT_i under a control of the pull-up node PU, wherein i is a positive integer not greater than N.

Each driving output terminal OUT_i can be coupled to one gate line in the display panel so as to drive one row of pixel units in the display panel. Accordingly, the N driving output circuits can drive N rows of pixel units in the display panel through the N driving output terminals.

In some embodiments, the shift output circuit 10 is provided with a pull-up node PU. The shift output circuit 10 can charge the pull-up node PU under a control of the input signal terminal IN. When the potential of the pull-up node PU is an effective potential, the control clock signal terminal CK is electrically coupled to the shift output terminal OUT, so that a control clock signal is inputted to the shift output terminal OUT. Meanwhile, each driving clock signal terminal is electrically coupled to a corresponding driving output terminal, and the driving clock signals are inputted to the corresponding driving output terminals respectively.

The pull down circuit 30 is respectively coupled to a pull-down power supply terminal VGL, each of the driving output terminals, a pull-down node PD in the shift output circuit 10, and the input signal terminal IN. The pull-down circuit 30 is configured to input the pull-down power supply signal from, the pull-down power supply terminal VGL to each of the driving output terminals under a control of the poll-down node PD and the input signal. The potential of the pull-down power supply signal is an ineffective potential.

In some embodiments, the shift output circuit 10 is provided with the pull-down node PD. The voltage change of the pull-down node PD is opposite to that of the pull-up node PU. When the potential of the pull-down node PD is an effective potential, the pull-down power supply terminal VGL can be electrically coupled to the pull-up node PU, the shift output terminal OUT and each of the driving output terminals respectively. As such, the noise to the pull-up node PU, the shift output terminal OUT and each of the driving output terminals is reduced, thereby eliminating coupling noise voltage generated by each of the clock signal terminals.

The shift register circuit provided by the embodiments of the present disclosure includes N driving output circuits. The N driving output circuits can be configured to output driving signals respectively under a control of the pull-up node to drive N-rows of pixel units. Compared with the conventional art in which each shift register circuit can only drive one row of pixel units, the shift register circuit provided by the embodiments of the present disclosure can reduce the number of shift register circuits required in a gate driving circuit. As such, the layout area occupied by the gate driving circuit in a display apparatus can be effectively reduced, thereby realizing an ultra-narrow frame.

Figure 2:
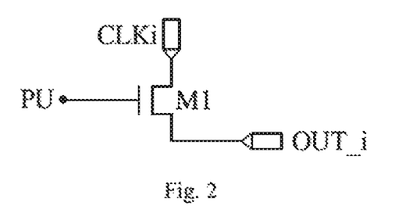
FIG. 2 is a schematic structural diagram of a driving output circuit according to some embodiments of the present disclosure.

FIG. 2 is a schematic structural diagram of a driving output circuit according to some embodiments of the present disclosure. As shown in FIG. 2, the i-th driving output circuit 20 includes a first transistor M1. That is, each of the driving output circuits 20 includes a first transistor M1.

In some embodiments, a gate electrode of the first transistor M1 is coupled to the pull-up node PU. A first electrode of the first transistor M1 is coupled to the i-th driving clock signal terminal CLKi. A second electrode of the first transistor M1 is coupled to the i-th driving output terminal OUT_i.

When the potential of the pull-up node PU is an effective potential, the first transistor M1 is turned on, so that the i-th driving clock signal terminal CLKi can input a driving clock signal to the corresponding i-th driving output terminal OUT_i.

Figure 3:
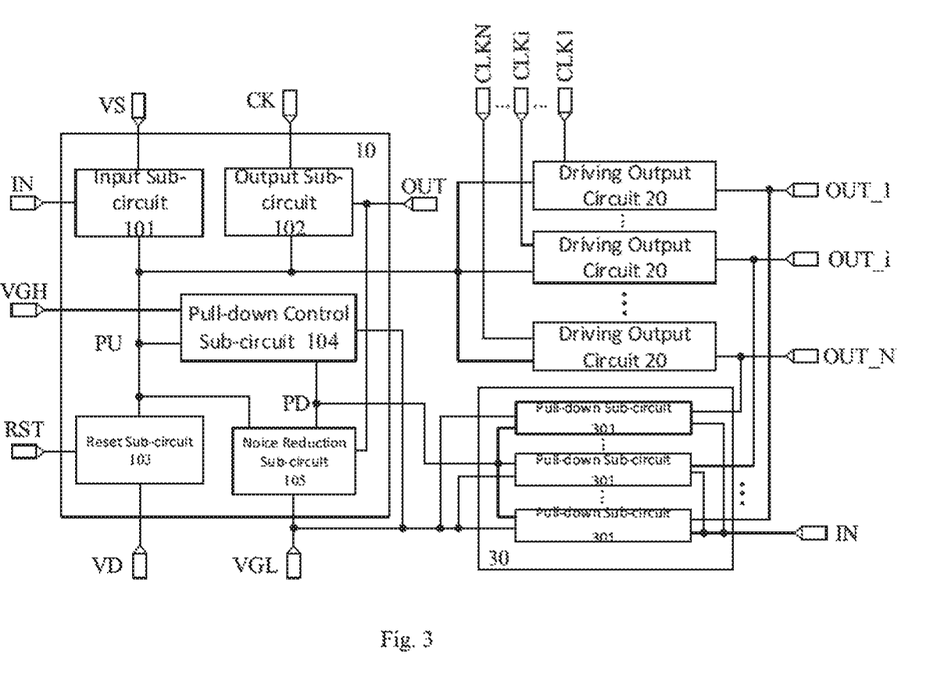
FIG. 3 is a schematic structural diagram of a shift register circuit according to some embodiments of the present disclosure.

FIG. 3 is a schematic structural diagram of a shift register circuit according to some embodiments of the present disclosure. As shown in FIG. 3, the pull-down circuit 30 includes N pull-down sub-circuits 301.

The i-th pull-down sub-circuit 301 among the N pull-down sub-circuits 301 is respectively coupled to the pull-down power supply terminal VGL, the i-th driving output terminal OUT_i, the pull-down node PD and the input signal terminal IN. The i-th pull-down sub-circuit 301 is configured to input the pull-down power supply signal to the i-th driving output terminal OUT_i under a control of the pull-down node PD and the input signal.

In some embodiments, the i-th pull-down sub-circuit 301 can input the pull-down power supply signal to the i-th driving output terminal OUT_i when the potential of the pull down node PD or the potential of the input signal is an effective potential, thereby reducing noise to the i-th driving output terminal OUT_i.

Figure 4:
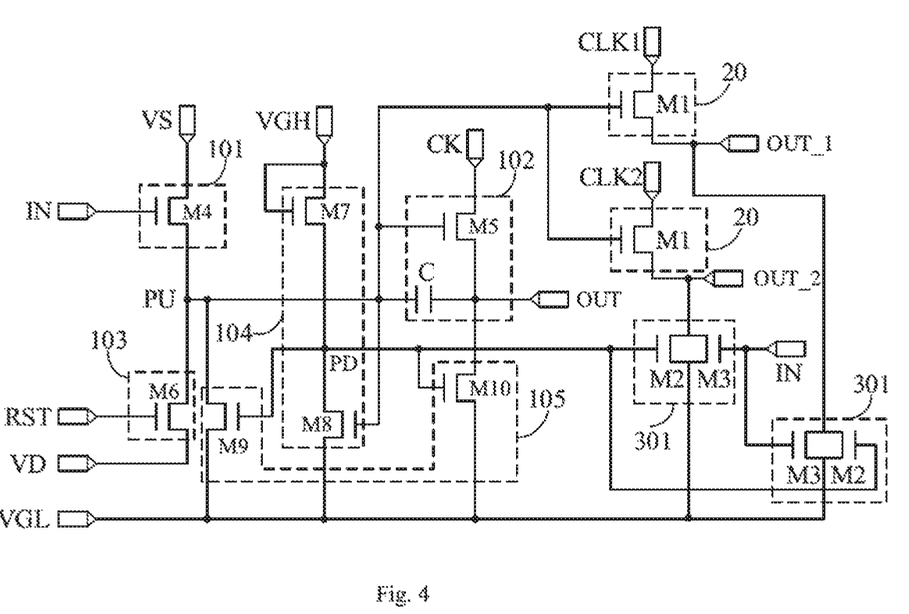
FIG. 4 is a schematic structural diagram of a shift register circuit according to some embodiments of the present disclosure.

FIG. 4 is a schematic structural diagram of one shift register circuit according to some embodiments of the present disclosure. As shown in FIG. 4, the i-th pull-down sub-circuit 301 includes a second transistor M2 and a third transistor M3.

In some embodiments, a gate electrode of the second transistor M2 is coupled to the pull-down node PD. A first electrode of the second transistor M2 is coupled to the pull-down power supply terminal VGL. A second electrode of the second transistor M2 is coupled to the i-th driving output terminal OUT_i.

In some embodiments, a gate electrode of the third transistor M3 is coupled to the input signal terminal IN. A first electrode of the third transistor M3 is coupled to the pull-down power supply terminal VGL. A second electrode of the third transistor M3 is coupled to the i-th driving output terminal OUT_i.

When the potential of the pull-down node PD is an effective potential, the second transistor M2 in each of the pull-down sub-circuits 301 is turned on, so that the pull-down power supply terminal VGL perform noise reduction on each of the driving output terminals. When the potential of the input signal is an effective potential, the third transistor M3 in each of the pull-down sub-circuits 301 is turned on, so that the pull-down power supply terminal VGL perform noise reduction on each of the driving output terminals.

In some embodiments, a duration of an effective potential of the driving clock signal from each of the driving clock signal terminals within each period is not larger than 1/N of a duration of an effective potential of the control clock signal within each period. As such, each of the driving clock signal terminals can sequentially output a driving clock signal of an effective potential under a stage that the control clock signal is at an effective potential.

In some embodiments, as shown in FIG. 4, the shift register circuit provided by the embodiments of the present disclosure includes two driving output circuits 20. Each of the two driving output circuit 20 is coupled to one of the two driving clock signal terminals CLK1 and CLK2.

Correspondingly, the period of the driving clock signal from each driving clock signal terminal is half of the period of the control clock signal. Also, the duty ratio of each of the driving clock signals and that of the control clock signal are one half.

In some embodiments, as shown in FIG. 3, the shift output circuit 10 includes an input sub-circuit 101, an output sub-circuit 102, a reset sub-circuit 103, a pull-down control sub-circuit 104, and a noise reduction sub-circuit 105.

The input sub-circuit 101 is respectively coupled to the input signal terminal IN, the first direct-current power source terminal VS, and the pull-up node PU. The input sub-circuit 101 is configured to input a first direct-current power source signal from the first direct-current power source terminal VS to the pull-up node PU under a control of the input signal. The potential of the first direct-current power supply signal can be an effective potential.

In some embodiments, the input sub-circuit 101 can be configured to input the first direct-current power source signal to the pull-up node PU when the potential of the input signal is an effective potential, so that the pull-up node PU is charged.

In some embodiments, the output sub-circuit 102 is respectively coupled to the pull-up node PU, the control clock signal terminal CK, and the shift output terminal OUT. The output sub-circuit 102 is configured to input the control clock signal to the shift output terminal OUT under a control of the pull-up node PU.

In some embodiments, when the potential of the pull-up node PU is an effective potential, the output sub-circuit 102 transmits the control clock signal to the shift output terminal OUT.

In some embodiments, the reset sub-circuit 103 is respectively coupled to the reset signal terminal RST, second direct-current power supply terminal VD, and the pull-up node PU. The reset sub-circuit 103 is configured to input a second direct-current power source signal from the second direct-current power source terminal VD to the pull-up node PU under a control of the reset signal. The potential of the second direct-current power supply signal is an ineffective potential.

In some embodiments, when the potential of the reset signal is an effective potential, the reset sub-circuit 103 transmits a signal from the second direct-current power source to the pull-up node PU, so that the pull-up node PU is discharged.

In some embodiments, the pull-down control sub-circuit 104 is respectively coupled to the pull-up node PU, the pull-down power supply terminal VGL, a pull-up power supply terminal VGH, and the pull-down node PD. The pull-down control sub-circuit 104 is configured to input a pull-down power supply signal from the pull-down power supply terminal or a pull-up power supply signal from the pull-up power supply signal terminal to the pull-down node PD under a control of the pull-up node PU. The potential of the pull-up power supply signal is an effective potential.

In some embodiments, when the potential of the pull-up node PU is an effective potential, the pull-down control sub-circuit 104 is configured to input the pull-down power supply signal to the pull-down node PD. When the potential of the pull-up node PU is an ineffective potential, the pull-down control sub-circuit 104 is configured to input a pull-up power supply signal to the pull-up node PU. Therefore, the potential of the pull-down node PD is opposite to that of the pull-up node PU.

The noise reduction sub-circuit 105 is respectively coupled to the pull-down node PD, the pull-down power supply terminal VGL, the pull-up node PU, and the shift output terminal OUT. The noise reduction sub-circuit 105 is configured to input pull-down power supply signal to the pull-up node PU and the shift output terminal OUT respectively under a control of the pull-down node PD.

In some embodiments, when the potential of the pull-down node PD is an effective potential, the noise reduction sub-circuit 105 respectively transmits the pull-down power supply signal to the pull-up node PU and the shift output terminal OUT, thereby reducing noise at the pull-up node PU and the shift output terminal OUT.

In some embodiments, as shown in FIG. 4, the input sub-circuit 101 includes a fourth transistor M4. The output sub-circuit 102 includes a fifth transistor M5 and a capacitor C. The reset sub-circuit 103 includes a sixth transistor M6. The pull-down control sub-circuit 104 includes a seventh transistor M7 and an eighth transistor M8. The noise reduction sub-circuit 105 includes a ninth transistor M9 and a tenth transistor M10.

In some embodiments, a gate electrode of the fourth transistor M4 is coupled to the input signal terminal IN. A first electrode of the fourth transistor M4 is coupled to the first direct-current power source terminal VS. A second electrode of the fourth transistor M4 is coupled to the pull-up node PU.

In some embodiments, a gate electrode of the fifth transistor M5 is coupled to the pull-up node PU. A first electrode of the fifth transistor M5 is coupled to the control clock signal terminal CK. A second electrode of the fifth transistor M5 is coupled to the shift output terminal OUT.

In some embodiments, one terminal of the capacitor C is coupled to the pull-up node PU, and the other terminal of the capacitor C is coupled to the shift output terminal OUT.

In some embodiments, a gate of the sixth transistor M6 is coupled to the reset signal terminal RST. A first electrode of the sixth transistor M6 is coupled to the second direct-current power source terminal VD. A second electrode of the sixth transistor M6 is coupled to the pull-up node PU.

In some embodiments, a gate electrode and a first electrode of the seventh transistor M7 are respectively coupled to the pull-up power supply terminal VGH. A second electrode of the seventh transistor M7 is coupled to the pull-down node PD.

In some embodiments, a gate electrode of the eighth transistor M8 is coupled to the pull-up node PU. A first electrode of the eighth transistor M8 is coupled to the pull-down power supply terminal VGL. A second electrode of the eighth transistor M8 is coupled to the pull-down node PD.

In some embodiments, a gate of the ninth transistor M9 is coupled to the pull-down node PD. A first electrode of the ninth transistor M9 is coupled to the pull-down power supply terminal VGL. A second electrode of the ninth transistor M9 is coupled to the pull-up node PU.

In some embodiments, a gate of the tenth transistor M10 is coupled to the pull-down node PD. A first electrode of the tenth transistor M10 is coupled to the pull-down power supply terminal VGL. A second electrode of the tenth transistor M10 is coupled to the shift output terminal OUT.

The width-to-length ratio of the channel of the eighth transistor M8 may be larger than that of the eighth transistor M7. In some embodiments, a ratio of the width-to-length ratio of the channel of M7 to the width-to-length ratio of the channel of M8 can be 1:3 or 1:5.

Since the gate electrode of the seventh transistor M7 is coupled to the pull-up power supply terminal VGH, the seventh transistor M7 is constantly in an ON state. To have a large width of the channel of the eighth transistor, when the eighth transistor M8 is turned on under a control of the pull-up node PU, the pull-down power supply terminal VGL can pull down the potential of the pull-down node PD, so that the ninth transistor M9 and the tenth transistor M10 are kept in an OFF state, thereby preventing affecting the potentials of the pull-up node PU and the shift output terminal OUT.

In some embodiments of the present disclosure, a shift register circuit is provided. The shift register circuit includes N driving output circuits. The N driving output circuits can be controlled to output driving signals respectively under a control of the pull-up nodes to drive N-row of pixel units. Compared with the conventional art in which each shift register circuit can drive only one row of pixel units, the shift register circuit provided by the embodiment of the present disclosure can reduce the number of shift register circuits required in the gate driving circuit, so that the layout area occupied by the gate driving circuit in the display apparatus can be effectively reduced, thereby facilitating the realization of the ultra-narrow frame.

Figure 5:
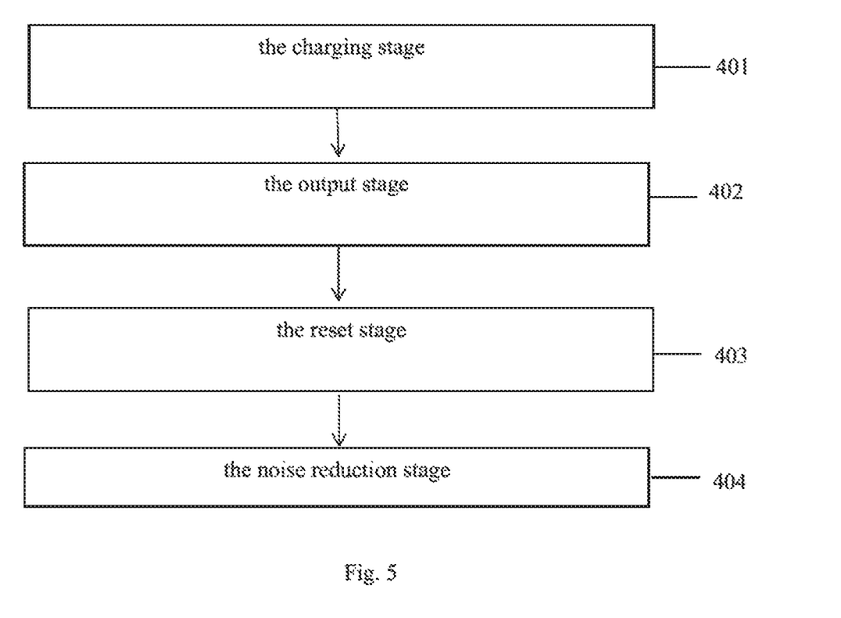
FIG. 5 is a flowchart of a driving method of a shift register circuit according to some embodiments of the present disclosure.

A driving method of a shift register circuit is provided according to some embodiments of the present disclosure. As shown in FIG. 1, the shift register circuit includes a shift output circuit 10, N driving output circuits 20, and a pull-down circuit 30, wherein N is an integer larger than 1. The driving method may include a charging stage, an output stage, a reset stage, and a noise reduction stage. The output stage includes N sub-output stages. As shown in FIG. 5, the driving method can include the following steps:

In step 401, during the charging stage, the potential of an input signal from an input signal terminal IN is an effective potential. The shift output circuit 10 charges the pull-up node PU under a control of the input signal. The pull-down circuit 30 transmits a pull-down power supply signal from the pull-down power supply terminal VGL to each of the N driving output terminals respectively under a control of the input signal. The potential of the pull-down power supply signal is an ineffective potential.

In step 402, during the output stage, the pull-up node PU is kept at an effective potential. The potential of the control clock signal from the clock signal terminal CK is an effective potential. Under a control of the pull-up node PU, the shift output circuit 10 is configured to input the control clock signal to the shift output terminal OUT. In the i-th sub-output stage of the N sub-output stages, the potential of the i-th driving clock signal from the i-th driving clock signal terminal among the N driving clock signal terminals is an effective potential. Under a control of the pull-up node PU, the i-th driving output circuit 20 is configured to input the i-th driving clock signal to the i-th driving output terminal.

Wherein, the i is a positive integer not greater than N.

In step 403, during the reset stage, the potential of the reset signal from the reset signal terminal RST is an effective potential. The shift output circuit 10 controls the potential of the pull-up node PU to be an ineffective potential. Each of the driving output circuits 20 stops outputting signals.

In step 404, during the noise reduction stage, the potential of the input signal and the potential of the pull-up node PU are ineffective potentials. The shift output circuit 10 controls the potential of the pull-down node PD to be an effective potential. Under a control of the pull-down node PD, the pull-down circuit 30 transmits a pull-down power supply signal to each of the driving output terminals respectively.

In the output stage, the N driving clock signal terminals can sequentially output driving clock signals of an effective potential.

In some embodiments of the present disclosure, a driving method of the shift register circuit is provided. The method includes a charging stage, an output stage, a reset stage, and a noise reduction stage. The output stage can include N sub-output stages. The signal from the shift register circuit in each sub-output stage can drive a row of pixel units. Comparing with shift register circuits in the related conventional art, in which only one row of pixel units can be driven during each output stage, the method provided by the embodiment of the present disclosure can drive pixel units of N rows in each output stage of the shift register circuit, thereby achieving a higher driving efficiency.

In some embodiments, as shown in FIG. 2, the i-th driving output circuit 20 includes a first transistor M1.

Correspondingly, in the i-th sub-output stage, the first transistor M1 in the i-th driving module is turned on under a control of the pull-up node PU. As such, the i-th driving clock signal terminal can input the i-th driving clock signal to the i-th driving output terminal to drive a row of pixel units.

In some embodiments, as shown in FIG. 3, the shift output circuit 10 includes an input sub-circuit 101, an output sub-circuit 102, a reset sub-circuit 103, a pull-down control sub-circuit 104, and a noise reduction sub-circuit 105.

Correspondingly, during the input stage, under a control of an input signal, the input sub-circuit 101 transmits a first direct-current power source signal from a first direct-current power source terminal VS to the pull-up node PU. The potential of the first direct-current power supply signal is an effective potential.

During the output stage, the pull-up node PU keeps at an effective potential. Under a control of the pull-up node PU, the output sub-circuit 102 transmits the control clock signal to the shift output terminal OUT. The pull-down control sub-circuit 104 transmits the pull-down power supply signal to the pull-down node PD under a control of the pull-up node PU.

During the reset stage, under a control of the reset signal, the reset sub-circuit 103 transmits a second direct-current power source signal from a second direct-current power source terminal VD to the pull-up node PU. The potential of the second direct-current power supply signal is an ineffective potential, so that the reset of the pull-up node PU is realized.

During the noise reduction stage, the pull-up node PU is an ineffective potential, and the pull-up power supply signal from the pull-up power supply terminal VGH is an effective potential. The pull-down control sub-circuit 104 transmits the pull-up power supply signal to the pull-down node PD. Under a control of the pull-down node PD, the noise reduction sub-circuit 105 transmits a pull-down power supply signal to the pull-up node PU and the shift output terminal OUT respectively, thereby realizing noise reduction to the pull-up node PU and the shift output terminal OUT.

Further, taking the shift register circuits shown in FIG. 4 as an example, without being held to a particular theory, the driving principle of the shift register circuits provided by the embodiments of the present disclosure is described in detail. Each of the transistors in the shift register circuits is an N-type transistor. In addition, the effective potential is a high potential relative to the ineffective potential.

Figure 6:
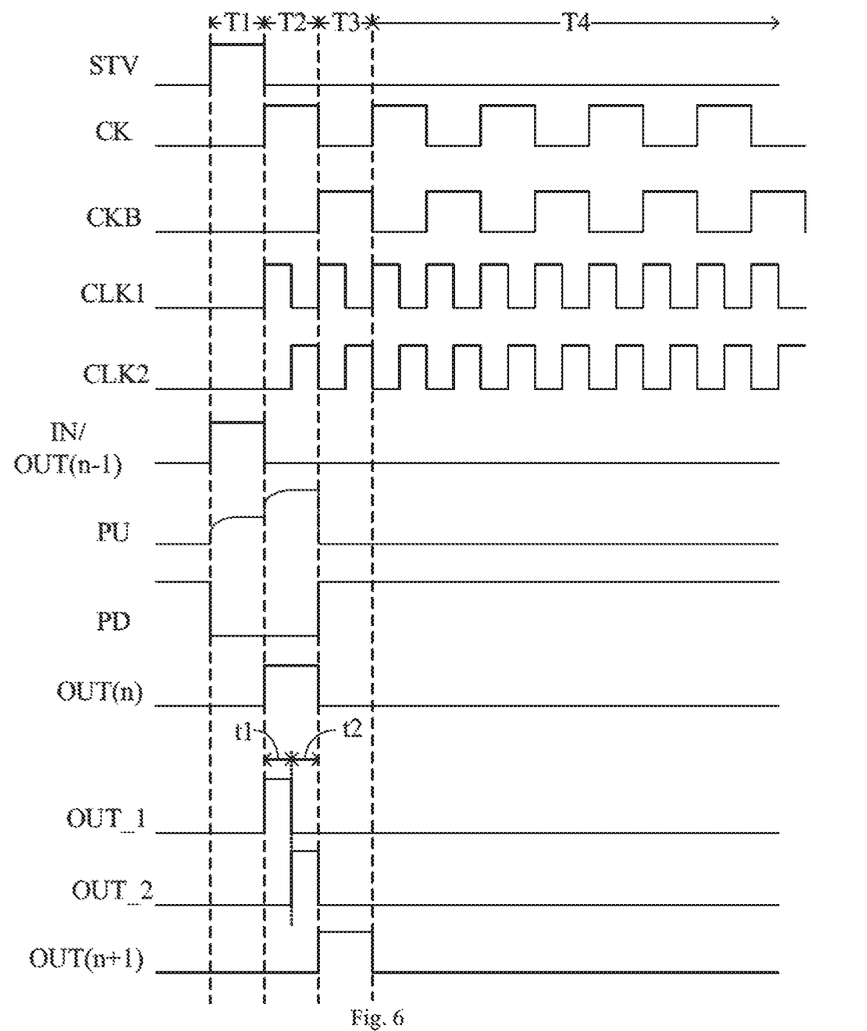
FIG. 6 is a timing diagram of signal terminals in a shift register circuit according to some embodiments of the present disclosure.

As shown in FIG. 6, it is assumed that the shift register circuit is a shift register of the N-th stage in a gate drive circuit. During the charging stage T1, the potential of the input signal from the input signal terminal IN, namely the shift output terminal OUT(N−1) of the shift register circuit of the previous stage is an effective potential. The potential of the control clock signal from the control clock signal terminal CK is an ineffective potential. The fourth transistor M4 is turned on under a control of the input signal. The first direct-current power supply terminal VS transmits a first direct-current power supply signal which is at the effective potential to the pull-up node PU to charge the capacitor C, so that the potential of the pull-up node PU is pulled high. At this moment, the fifth transistor M5 and the first transistors M1 in each of the driving output circuits 20 are turned on. The control clock signal terminal CK can input a control clock signal of an ineffective potential to the shift output terminal OUT (N). Each driving clock signal terminal can input a driving clock signal to a corresponding driving output terminal. In addition, since the input signal from the input signal terminal IN can control the third transistor M3 in each of the pull-down sub-circuits 301 to be turned on, so that the pull-down power supply terminal VGL can input a pull-down power supply signal of an ineffective potential to each of the driving output terminals. Therefore, even if the potential of the driving clock signal from the first driving clock signal terminal CLK1 or the second driving clock signal terminal CLK2 during the input stage T1 is an effective potential, the potentials of the driving output terminals cannot be influenced, thereby guaranteeing stability of the potentials of the driving output terminals.

Meanwhile, since the potential of the pull-up power supply signal from the pull-up power supply terminal VGH is an effective potential, the seventh transistor M7 is turned on, so that the pull-up power supply terminal VGH can input a pull-up power supply signal to the pull-down node PD. Since the eighth transistor M8 can be turned on under a control of the pull-up node PU, the pull-down power supply terminal VGL can input a pull-down power supply signal to the pull-down node PD. In the embodiments of the present disclosure, the width-to-length ratio of the channel of the eighth transistor M8 can be set to be relatively large to increase the volume of the leakage current from the eighth transistor M8, thereby guaranteeing that the pull-down power supply terminal VGL can pull down the potential of the pull-down node PD to a low potential through the eighth transistor M8 when the seventh transistor M7 and the eighth transistor M8 are turned on. The ninth transistor M9 and the tenth transistor M10 in the noise reduction sub-circuit 105 are both turned off, thereby guaranteeing the stability of the potential of the pull-up node PU and the shift output terminal OUT, which also further guaranteeing the stability of signals from each of the driving output terminals.

During the output stage T2, the pull-up node PU maintains an effective potential. The potential of the control clock signal from the clock signal terminal CK is changed into an effective potential. The potential of the pull-up node PU is further pulled up under the bootstrap effect. As such, a control clock signal terminal CK transmits the control clock signal to the shift output terminal OUT(N) through the fifth transistor M5.

As shown in FIG. 4, the shift register circuit includes two driving output circuits 20. As shown in FIG. 6, the output stage T2 includes two sub-output stages which are t1 and t2. During a first sub-output stage t1, the potential of the first driving clock signal from the first driving clock signal terminal CLK1 is an effective potential. The first transistor M1 in the first driving output circuit 20 transmits the first clock signal of an effective potential to the first driving output terminal OUT_1 under a control of the pull-up node PU, thereby realizing driving of a row of pixel units. During the second sub-output stage T2, the potential of the second driving clock signal from the second driving clock signal terminal CLK2 is an effective potential. The first transistor M1 in the second driving output circuit 20 can input the second clock signal of the effective potential to the second driving output terminal OUT_2 under a control of the pull-up node PU, thereby realizing driving of another row of pixel units.

Similarly, during the output stage T2, since the potential of the pull-up node PU is an effective potential, the eighth transistor M8 is kept in an ON state, so that the pull-down power supply terminal VGL continuously pulls low the potential of the pull-down node PD, and the ninth transistor M9 and the tenth transistor M10 in the noise reduction sub-circuit 105 are turned off, thereby guaranteeing the stability of the potentials of the pull-up node PU and the shift output terminal OUT as well as the stability of signals from each of the driving output terminals.

During the reset stage T3, as shown in FIG. 6, the output signal of the shift output terminal OUT (N+1) of shift register circuit of the next stage is an effective potential. Since the shift output terminal OUT (N+1) is coupled to the reset signal terminal RST of the shift register circuit of the current stage, the potential of the reset signal from the reset signal terminal RST is an effective potential. At this moment, the second direct-current power supply terminal VD transmits a second direct-current power supply signal of an ineffective potential to the pull-up node PU, so that the potential of the pull-up node PU is reset, and the fifth transistor M5, the eighth transistor M8, and the first transistors M1 in each of the driving output circuits 20 are turned off. The shift output terminal OUT and each of the driving output terminals stop outputting signals. Meanwhile, since the eighth transistor M8 is turned off, the pull-down power supply terminal VGL does not discharge the pull-down node PD. Therefore, as shown in FIG. 6, the potential of the pull-down node PD is changed into an effective potential under a control of the pull-up power supply terminal VGH.

During the noise reduction stage T4, as shown in FIG. 6, the potential of the input signal and the potential of the pull-up node PU are ineffective potentials. The pull-up power supply terminal VGH can keep the potential of the pull-down node PD at an effective potential through the seventh transistor M7, so that the ninth transistor M9, the tenth transistor M10, and the second transistor M2 in each of the pull-down sub-circuits 301 are in an ON state. As such, the pull-down power supply terminal VGL can respectively input a pull-down power supply signal to the pull-up node PU, the shift output terminal OUT, and each of the driving output terminals, thereby eliminating the coupling noise voltage of each of the output terminals.

In some embodiments, after the reset stage T3 and before the next frame arrives, the shift register circuit can be always in the noise reduction stage T4, namely the noise reduction sub-circuit 105 and each of the pull-down sub-circuits 301 can continuously perform noise reduction on the shift output terminal OUT and each of the driving output terminals, so that the impact thereof on output signals of shift register circuits of other stages is avoided, thereby guaranteeing the stability of the output of signals.

In the embodiment of the present disclosure, the duration of the effective potential of each of the driving clock signals from each of the driving clock signal terminals within each period can be no larger than 1/N of the duration of the effective potential of the control clock signal within each period. For example, the duration of the effective potential of the driving clock signals from each of the driving clock signal terminals within each period is equal to 1/N of the duration of the effective potential of the control clock signal within each period. Accordingly, the duration of each sub-output stage is no larger than 1/N of the duration of the output stage. For example, it can be equal to 1/N of the duration of the output stage.

In addition, when the potential of the driving clock signal from any one of the driving clock signal terminals of the N driving clock signal terminals is an effective potential, the potential of the driving clock signal from each driving clock signal terminal among the other N−1 driving clock signal terminals should be ineffective potentials. That is, the periods that the potentials of the driving clock signals from the N driving clock signal terminals at an effective potential are not overlapped in the time sequence, thereby preventing abnormal display on the display panel caused by the fact that two driving clock signals are both at an effective potential at the same time.

In some embodiments, as shown in FIG. 4, the shift register circuit includes two driving output circuits 20. Each driving output circuit 20 is coupled to one of the first driving clock signal terminal CLK1 and the second driving clock signal terminal CLK2 respectively. As shown in FIG. 6, the time sequence of the driving clock signals from the two driving clock signal terminals CLK1 and CLK2 is complementary. That is, the frequency of the two driving clock signals is the same, and the phases of the two driving clock signals are opposite. In addition, it can also be seen from FIG. 6, that the period of the driving clock signal from each driving clock signal terminal can be half of the period of the control clock signal from the control clock signal terminal CK. Furthermore, the duty ratio of each driving clock signal and the duty ratio of the control clock signal can be one half.

Accordingly, it can be seen from FIG. 6 that the output stage T2 can include two sub-output stages, t1 and t2. The duration of each of the sub-output stages is one half of the duration of the output stage T2.

In the above embodiments, for illustration purpose, each of the transistors is an N-type of transistor, and the effective potential is a higher potential relative to the ineffective potential. In some other embodiments, the transistors can also adopt P-type of transistors. When the transistor adopts a P-type of transistor, the effective potential is a lower potential relative to the ineffective potential. Furthermore, the potential change of each of the signal terminals can be opposite to the potential change shown in FIG. 6.

The driving method of the shift register circuit provided by the embodiments of the present disclosure includes a charging stage, an output stage, a reset stage, and a noise reduction stage. The output stage can include N sub-output stages. The signal from the shift register circuit in each sub-output stage can drive a row of pixel units. Compared with a shift register circuit in the related conventional art in which only one row of pixel units can be driven in each output stage, the method provided by the embodiments of the present disclosure can drive N rows of pixel units in each output stage of the shift register circuit, thereby achieving a relatively higher driving efficiency.

Figure 7:
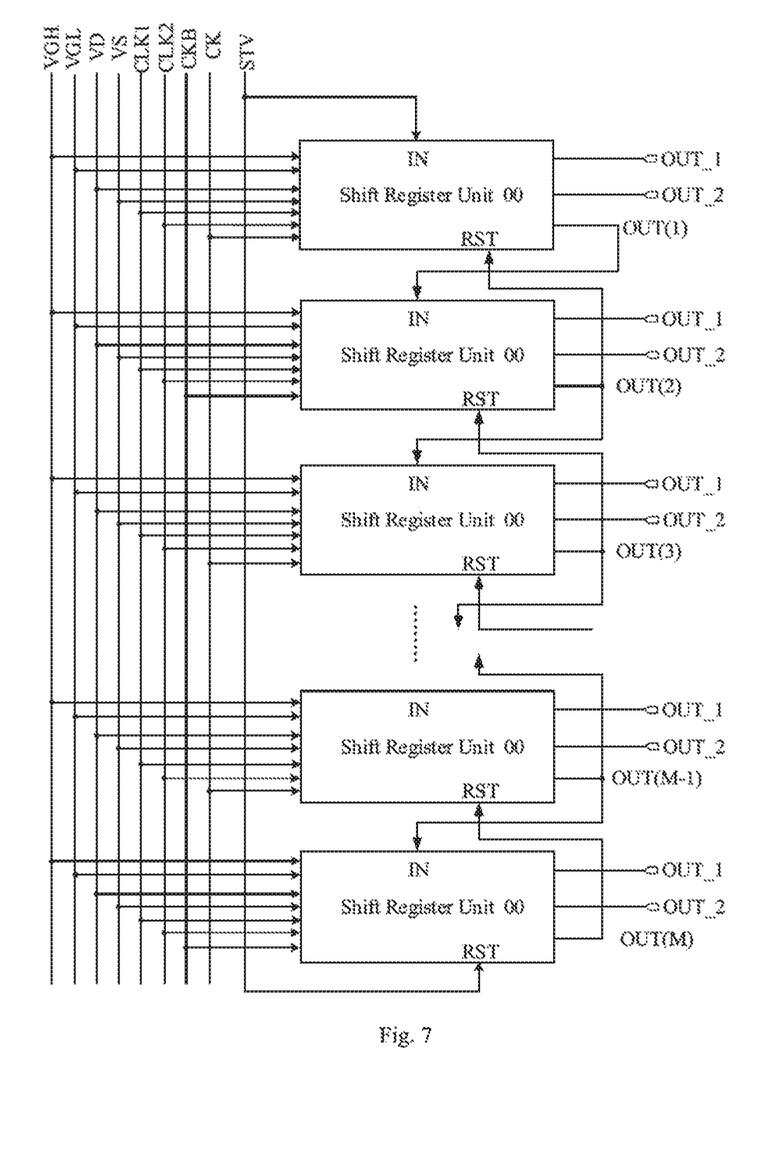
FIG. 7 is a schematic structural diagram of a gate driving circuit according to some embodiments of the present disclosure.

FIG. 7 is a schematic structural diagram of a gate driving circuit according to some embodiments of the present disclosure. As shown in FIG. 7, the gate driving circuit includes at least two cascaded shift register circuits 00, wherein each shift register circuit 00 can be a shift register circuit as shown in FIG. 1, FIG. 3 or FIG. 4.

As can be seen from FIG. 7, each stage of the shift register circuit includes two driving output terminals OUT_1 and OUT_2, wherein each driving output terminal can be coupled to one gate line in the display panel, so that each stage of shift register circuit can drive two rows of pixel units in the display panel. Compared with a shift register circuit which can only drive one row of pixel units in the related conventional art, by means of the shift register circuit provided by the embodiments of the present disclosure, the number of the shift register circuits required to be set in the gate driving circuit can be reduced by one half, thereby effectively reducing the layout area occupied by the gate driving circuit in the display apparatus and facilitating the implementation of an ultra-narrow frame.

As can be seen from FIG. 7, the shift output terminal of shift register circuit of each stage can be respectively coupled to the input signal terminal IN of the shift register circuit of the next stage and the reset signal terminal RST of the shift register circuit of the previous stage. For example, the shift output terminal OUT(2) of the shift register circuit of the second stage can be respectively coupled to the reset signal terminal RST of the shift register circuit of the first stage, and an input signal terminal IN of the shift register circuit of the third stage.

In the gate driving circuit shown in FIG. 7, M cascaded shift register circuits 00 are shown, wherein the input signal terminal IN of the shift register circuit of the first stage and the reset signal terminal RST of the shift register circuit of the last stage are respectively coupled to a trigger signal terminal STV. A trigger signal from the trigger signal terminal STV can charge the pull-up node in the shift register circuit of the first stage, and can reset the pull-up node in shift register circuit of the last stage.

As shown in FIG. 7, the gate driving circuit can be respectively coupled to the first control clock signal terminal CK and the second control clock signal terminal CKB. In addition, the adjacent two stages of shift register circuits can be coupled to one of the control clock signal terminals respectively. For example, in the circuit shown in FIG. 7, the shift register circuits of odd stages are coupled to the first control clock signal terminal CK, and the shift register circuits of even stages are coupled to the second control clock signal terminal CKB. As can be seen from FIG. 6, the time sequence of clock signal from the first control clock signal terminal CK and the clock signal from the second control clock signal terminal CKB are complementary. That is, the control clock signals from the two control clock signal terminals are identical in frequency and opposite in phase.

The gate driving circuit provided by the embodiments of the present disclosure has a bidirectional scanning function. When the scanning direction of the gate driving circuit needs to be adjusted, it is only needed to interchange the time sequences of the direct-current power source signals from the first direct-current power source terminal VS and the direct-current power source terminal VD, and to adjust the time sequence of the control clock signal from each of the control clock signal terminals in the gate driving circuit. For example, the time sequence of the control clock signals from the clock signal terminal CK and the control clock signal terminal CKB are interchanged.

Specifically, when the potential of the first direct-current power supply signal from the first direct-current power supply terminal VS is an effective potential, and the second direct-current power supply signal from the second direct-current power supply terminal VD is an ineffective potential, and the control clock signal terminal CK outputs a control clock signal of an effective potential ahead of the control clock signal terminal CKB, the shift register circuits in the gate driving circuit can be sequentially started from the shift register circuit of the first stage. As such, the forward scanning of the display apparatus can be realized. When the potential of the first direct-current power supply signal is an ineffective potential, the second direct-current power supply signal is an effective potential, and the control clock signal terminal CKB output a control clock signal of an effective potential ahead of the control clock signal terminal CK, the shift register circuits in the gate driving circuit can be sequentially started from the shift register circuit of the last stage. As such, the reverse scanning of the display apparatus can be realized.

A display apparatus is provided according to some embodiments of the present disclosure. The display apparatus can include a display panel and a gate driving circuit as shown in FIG. 7. The display panel includes a plurality of gate lines, and the shift register circuits of each stage in the gate driving circuit can include N driving output terminals. Each driving output terminal is coupled to one of the plurality of gate lines in the display panel. The display apparatus can be a liquid crystal panel, electronic paper, an OLED panel, an AMOLED panel, a mobile phone, a tablet computer, a television, a notebook computer, a digital photo frame, a navigator, and other products or parts with display functions.

One skilled in the art can clearly understand that, for convenience and brevity, the specific working process of the gate driving circuit, the shift register circuit and each of the circuits described above can reference to the corresponding process in the method embodiments, and the description is not repeated herein.

The principle and the embodiment of the disclosures are set forth in the specification. The description of the embodiments of the present disclosure is only configured to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A shift register circuit comprising:
   a shift output circuit; and
   N driving output circuits;
   wherein N is an integer larger than 1;
   among the N driving output circuits, an i-th driving output circuit is respectively coupled to an i-th driving clock signal terminal of N driving clock signal terminals, a pull-up node of the shift output circuit, and an i-th driving output terminal of N driving output terminals;
   the i-th driving output circuit is configured to input an i-th driving clock signal from the i-th driving clock signal terminal to the i-th driving output terminal under a control of the pull-up node, wherein i is a positive integer not greater than N;
   the shift output circuit is respectively coupled to an input signal terminal, a reset signal terminal, a control clock signal terminal, and a shift output terminal; and
   the shift output circuit is configured to control a potential of the shift output terminal under a control of the input signal from the input signal terminal, a reset signal from the reset signal terminal, and a control clock signal from the control clock signal terminal;

the shift register circuit further includes a pull-down circuit, the pull down circuit is respectively coupled to a pull-down power supply terminal, each of the driving output terminals, a pull-down node of the shift output circuit, and the input signal terminal; and the pull-down circuit is configured to input the pull-down power supply signal from the pull-down power supply terminal to each of the driving output terminals under a control of the pull-down node and the input signal.

2. The shift register circuit according to claim 1, wherein the i-th driving output circuit comprises a first transistor;
a gate electrode of the first transistor is coupled to the pull-up node, a first electrode of the first transistor is coupled to the i-th driving clock signal terminal, and a second electrode of the first transistor is coupled to the i-th driving output terminal.

3. The shift register circuit according to claim 1, wherein the pull-down circuit comprises N pull-down sub-circuits;
an i-th pull-down sub-circuit of the N pull-down sub-circuits is respectively coupled to the pull-down power supply terminal, the i-th driving output terminal, the pull-down node and the input signal terminal, and
the i-th pull-down sub-circuit is configured to input the pull-down power supply signal to the i-th driving output terminal under a control of the pull-down node and the input signal.

4. The shift register circuit according to claim 3, wherein the i-th pull-down sub-circuit comprises a second transistor and a third transistor;
a gate electrode of the second transistor is coupled to the pull-down node, a first electrode of the second transistor is coupled to the pull-down power supply terminal, and a second electrode of the second transistor is coupled to the i-th driving output terminal; and
a gate electrode of the third transistor is coupled to the input signal terminal, a first electrode of the third transistor is coupled to the pull-down power supply terminal, and a second electrode of the third transistor is coupled to the i-th driving output terminal.

5. The shift register circuit according to claim 1, wherein the shift register circuit comprises two driving output circuits, each of the driving output circuits is coupled to one of two driving clock signal terminals;
a period of the driving clock signal from each of the driving clock signal terminals is half of a period of the control clock signal, and a duty ratio of each of the driving clock signals and that of the control clock signal are one half respectively.

6. The shift register circuit according to claim 1, wherein the shift output circuit comprises an input sub-circuit, an output sub-circuit, a reset sub-circuit, a pull-down control sub-circuit, and a noise reduction sub-circuit;
the input sub-circuit is respectively coupled to the input signal terminal, the first direct-current power source terminal, and the pull-up node; the input sub-circuit is configured to input a first direct-current power source signal from the first direct-current power source terminal to the pull-up node under a control of the input signal;
the output sub-circuit is respectively coupled to the pull-up node, the control clock signal terminal, and the shift output terminal; the output sub-circuit is configured to input the control clock signal to the shift output terminal under a control of the pull-up node;
the reset sub-circuit is respectively coupled to the reset signal terminal, the second direct-current power supply terminal and the pull-up node; the reset sub-circuit is configured to input a second direct-current power source signal from the second direct-current power source terminal to the pull-up node under a control of the reset signal;

the pull-down control sub-circuit is respectively coupled to the pull-up node, the pull-down power supply terminal, the pull-up power supply terminal, and the pull-down node; the pull-down control sub-circuit is configured to input the pull-down power supply signal from the pull-down power supply terminal or the pull-up power supply signal from the pull-up power supply signal terminal to the pull-down node under a control of the pull-up node; and the noise reduction sub-circuit is respectively coupled to the pull-down node, the pull-down power supply terminal, the pull-up node, and the shift output terminal; the noise reduction sub-circuit is configured to input the pull-down power supply signal to the pull-up node and the shift output terminal respectively under a control of the pull-down node.

7. A driving method of a shift register circuit, the driving method comprising a charging stage, an output stage, a reset stage, and a noise reduction stage,
wherein the output stage comprises N sub-output stages; the shift register circuit comprises a shift output circuit, N driving output circuits, a pull-down circuit, wherein N is an integer larger than 1;
during the charging stage, a potential of an input signal from an input signal terminal is an effective potential, the shift output circuit charges a pull-up node under a control of the input signal, the pull-down circuit transmits a pull-down power supply signal from a pull-down power supply terminal to each of N driving output terminals respectively under a control of the input signal, a potential of the pull-down power supply signal is an ineffective potential;
during the output stage, the pull-up node is kept at an effective potential, a potential of a control clock signal from a clock signal terminal is an effective potential, the shift output circuit transmits the control clock signal to the shift output terminal under a control of the pull-up node, in an i-th sub-output stage of N sub-output stages, a potential of an i-th driving clock signal from an i-th driving clock signal terminal of N driving clock signal terminals is an effective potential, the i-th driving output circuit transmits the i-th clock signal to the i-th driving output terminal under a control of the pull-up node;
during the reset stage, a potential of a reset signal from a reset signal terminal is an effective potential, the shift output circuit controls the potential of the pull-up node to be an ineffective potential, each of the driving output circuits stops outputting signals; and
during the noise reduction stage, the potential of the input signal and the potential of the pull-up node are ineffective potentials; the shift output circuit controls the potential of the pull-down node to be an effective potential, the pull-down circuit transmits the pull-down power supply signal to each of the driving output terminals respectively under a control of the pull-down node .

8. The driving method according to claim 7, wherein, during the output stage, the N driving clock signal terminals sequentially output driving clock signals of an effective potential.

9. The driving method according to claim 7, wherein the i-th driving output circuit includes a first transistor;

during the i-th sub-output stage, the first transistor in the i-th driving output circuit is turned on under a control of the pull-up node, and the i-th driving clock signal terminal transmits the i-th driving clock signal to the i-th driving output terminal.

10. The driving method according to claim 9, wherein a duration of an effective potential of each of the driving clock signals from each of the driving clock signal terminals within each period is not larger than 1/N of a duration of an effective potential of the control clock signal within each period, and a duration of each of the sub-output stages is not larger than 1/N of a duration of the output stage.

11. The driving method according to claim 10, wherein a potential of a driving clock signal from one of the N driving clock signal terminals is an effective potential, and potentials of driving clock signals from the other N−1 driving clock signal terminals are ineffective potentials.

12. The driving method according to claim 11, wherein the shift register circuit comprises two driving output circuits, the output stage comprises two sub-output stages, and a duration of each of the sub-output stages is one half of a duration of the output stage.

13. The driving method according to claim 12, wherein the two driving output circuits are coupled to a first driving clock signal terminal and a second driving clock signal terminal respectively, and time sequences of the driving clock signals from the two driving clock signal terminals are complementary to each other.

14. A gate driving circuit, comprising at least two cascaded shift register circuits, each of the at least two cascaded shift register circuits being the shift register circuit according to claim 1,
wherein a shift output terminal of a shift register circuit of each stage is respectively coupled to an input signal terminal of a shift register circuit of a next stage and a reset signal terminal of a shift register circuit of a previous stage.

15. A display apparatus, comprising a display panel and the gate driving circuit according to claim 14,
wherein the display panel comprises a plurality of gate lines;
each stage of shift register circuit in the gate drive circuit includes N driving output terminals, and each of the driving output terminal is coupled to one of the plurality of the gate lines in the display panel respectively, wherein N is an integer greater than 1.

* * * * *